US008759673B2

(12) United States Patent
Chen et al.

(10) Patent No.: US 8,759,673 B2
(45) Date of Patent: Jun. 24, 2014

(54) RECEPTACLE FOR TRANSFORMER

(75) Inventors: Lien-Hsing Chen, Taichung (TW); Chiang-Hsin Hou, Taichung (TW); Wei-Sheng Wang, Taichung (TW)

(73) Assignee: Power Mate Technology Co., Ltd., Taichung (TW)

( * ) Notice: Subject to any disclaimer, the term of this patent is extended or adjusted under 35 U.S.C. 154(b) by 201 days.

(21) Appl. No.: 13/307,603

(22) Filed: Nov. 30, 2011

(65) Prior Publication Data

US 2013/0092411 A1 Apr. 18, 2013

(30) Foreign Application Priority Data

Oct. 17, 2011 (TW) ............................ 100137551 A

(51) Int. Cl.
*H05K 5/00* (2006.01)

(52) U.S. Cl.
USPC .......... 174/50; 174/520; 174/59; 364/679.01; 336/90

(58) Field of Classification Search
USPC .......... 174/50, 17 R, 520, 559, 59, 60, 138 F; 220/3.2, 4.02, 4.023; 361/600, 601, 361/679.01; 336/90, 92, 199, 192, 177, 198
See application file for complete search history.

(56) References Cited

U.S. PATENT DOCUMENTS 3,534,312 A * 10/1970 Grasinger ..................... 336/192
3,551,864 A * 12/1970 Spoldi et al. .................. 336/198
3,939,450 A * 2/1976 Donnelly ...................... 336/192
4,027,279 A * 5/1977 Shigehara .................. 174/138 F
4,146,860 A * 3/1979 Miller ........................... 336/192
4,363,014 A * 12/1982 Leach et al. ............... 174/138 F
7,859,380 B2 * 12/2010 Hasenour et al. ............. 336/198
2012/0161913 A1 * 6/2012 Yen .............................. 336/199

* cited by examiner

*Primary Examiner* — Angel R Estrada
(74) *Attorney, Agent, or Firm* — Muncy, Geissler, Olds & Lowe, P.C.

(57) ABSTRACT

A receptacle includes an electrically insulative bottom wall, and an electrically insulative upright wall upwardly extended from the border of the bottom wall, the upright wall having a back wall portion corresponding to the rear side of the bottom wall. The bottom wall is adapted for mounting at a circuit board or electronic device to hold a transformer in such a manner that the lead wires of the primary winding of the transformer are disposed at the front side of the bottom wall; the insulated lead wires of the secondary winding of the transformer are extended over the top edge of the back wall portion and then turned downwardly and bonded to the circuit board or electronic device.

14 Claims, 10 Drawing Sheets

RECEPTACLE FOR TRANSFORMER

BACKGROUND OF THE INVENTION

1. Field of the Invention

The present invention relates to the electronic component of transformer and more particularly, to a receptacle for holding a transformer on a circuit board.

2. Description of the Related Art

A transformer generally comprises a bobbin, an iron core and windings. The bobbin comprises a plurality of primary-side contacts and secondary-side contacts. The lead wires of the primary winding and secondary winding are respectively electrically bonded to the primary-side contacts and secondary-side contacts. This is the basic architecture of a transformer.

When mounting a transformer on a circuit board, corresponding contacts are made at the circuit board, and then the primary-side contacts and secondary-side contacts of the transformer are respectively bonded to the contacts at the circuit board, finishing the installation. However, in some conditions where security requirements are critical, a relatively longer insulation distance between the contacts at the circuit board to which the secondary winding of the transformer is bonded and the contacts at the circuit board to which the primary winding of the transformer is bonded. In this case, the aforesaid conventional transformer installation method is not acceptable.

To meet the requirement for a relatively longer insulation distance, one conventional method is known by: directly extending the length of the lead wires 94' of the secondary winding of the transformer 91' and then bonding the lead wires 94' to the circuit board. Thus, a distance L between the bonding ends of the lead wires 92' of the primary winding of the transformer 91' at the circuit board 99' and the bonding ends of the lead wires 94' of the secondary winding of the transformer 91' at the circuit board 99' that meets the security codes is obtained. According to this mounting method, the lead wires of the primary winding and the lead wires of the secondary winding are wrapped by an electrically insulative material, as shown in FIG. 17. Further, in another prior art design, the lead wires 92" of the primary winding of the transformer 91" are bare wires, and the lead wires 94" of the secondary winding of the transformer 91" are wrapped by an electrically insulative material. During installation, as shown in FIG. 18, the lead wires 94" of the secondary winding of the transformer 91" must be extended before bonding to the circuit board 99" so that the insulation distance can meet the safety codes.

However, this installation method does not allow the presence of any device between the transformer and the secondary-side contacts, wasting much circuit board space. Under the market trend to create small size device or component, it is pity to waste circuit board in this manner.

Therefore, there is a demand for a measure to avoid wasting circuit board space while meeting safety codes.

SUMMARY OF THE INVENTION

The present invention has been accomplished under the circumstances in view. It is the main object of the present invention to provide a receptacle for transformer, which saves insulation space and meets insulation safety codes.

To achieve this and other objects of the present invention, a receptacle for transformer comprises a bottom wall made of an electrically insulative material, and an upright wall made of an electrically insulative material. The upright wall extends upwardly from the border of the bottom wall, comprising a back wall portion corresponding to the rear side of the bottom wall. The bottom wall is adapted for mounting at a circuit board or electronic device to hold a transformer in such a manner that the lead wires of the primary winding of the transformer are disposed at the front side of the bottom wall; the insulated lead wires of the secondary winding of the transformer are extended over the top edge of the back wall portion of the upright wall and turned downwardly toward the circuit board or electronic device and then electrically bonded to the circuit board or electronic device.

Other advantages and features of the present invention will be fully understood by reference to the following specification in conjunction with the accompanying drawings, in which like reference signs denote like components of structure.

DETAILED DESCRIPTION OF THE INVENTION

Figure 1:
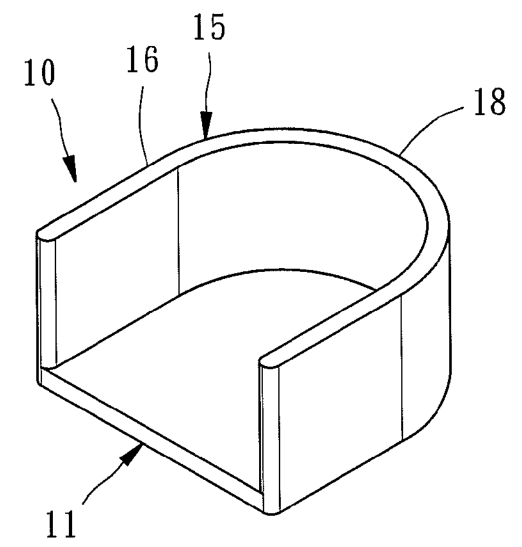
FIG. 1 is an oblique front elevation of a receptacle for transformer in accordance with a first embodiment of the present invention.
Figure 2:
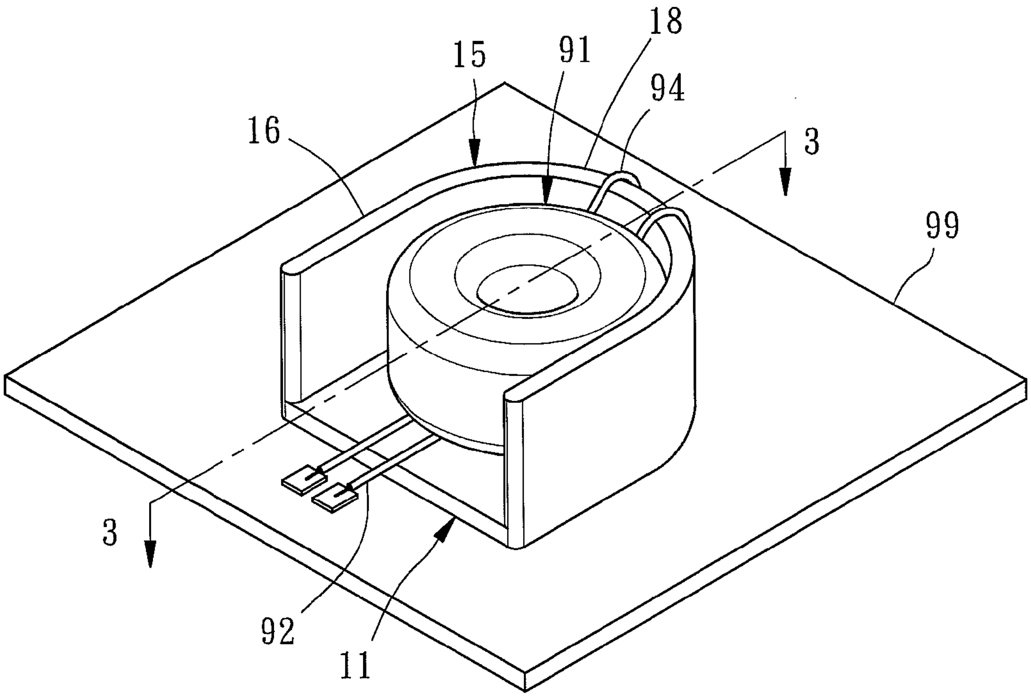
FIG. 2 is a schematic applied view of the first embodiment of the present invention, illustrating the receptacle installed in a circuit board and a transformer mounted inside the receptacle.
Figure 3:
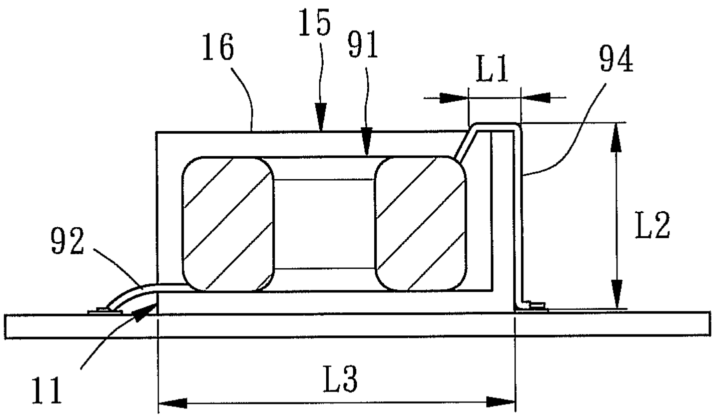
FIG. 3 is a sectional view taken along line 3-3 of FIG. 2.
Figure 4:
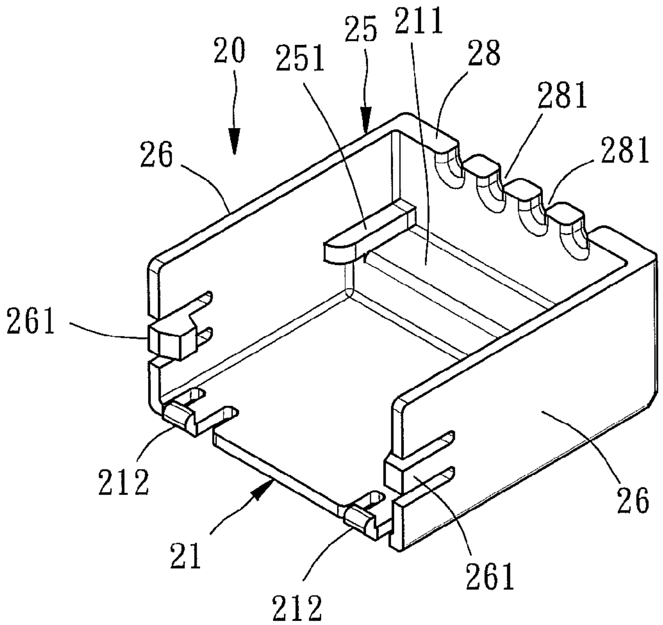
FIG. 4 is an oblique front elevation of a receptacle for transformer in accordance with a second embodiment of the present invention.
Figure 5:
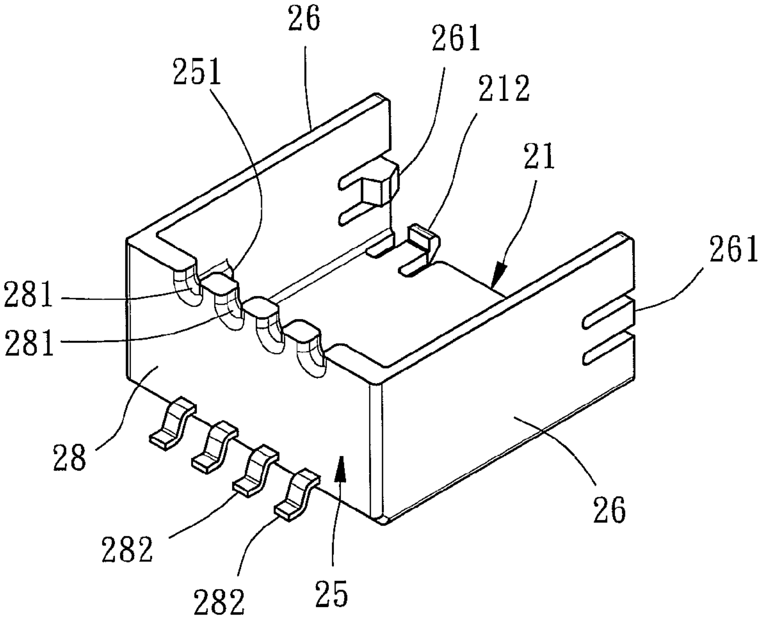
FIG. 5 is an oblique rear elevation of the receptacle for transformer in accordance with the second embodiment of the present invention.
Figure 6:
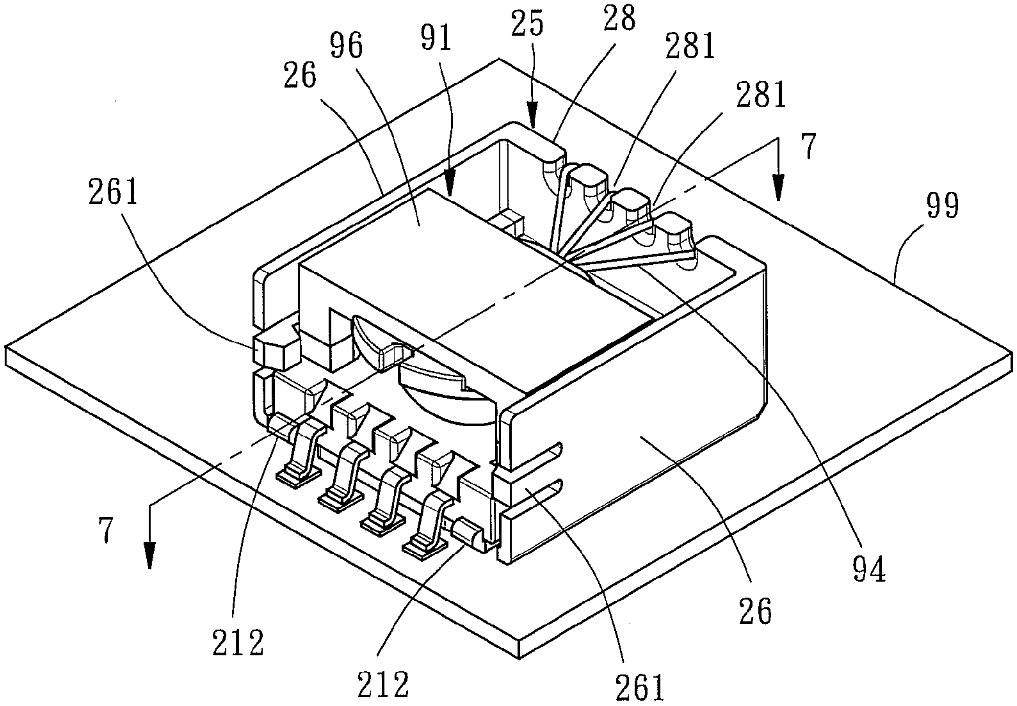
FIG. 6 is a schematic applied view of the second embodiment of the present invention, illustrating the receptacle installed in a circuit board and a transformer mounted inside the receptacle.
Figure 7:
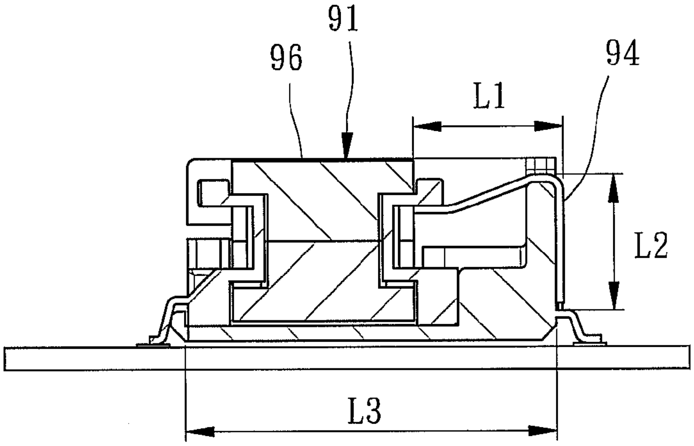
FIG. 7 is a sectional view taken along line 7-7 of FIG. 6.

Referring to FIGS. 1-3, a receptacle 10 for transformer in accordance with a first embodiment of the present invention is shown. The receptacle 10 comprises a bottom wall 11, and an upright wall 15 formed integral with the bottom wall 11. The bottom wall 11 and the upright wall 15 are electrically insulative.

The upright wall 15 extends upwardly from the border of the bottom wall 11, comprising two lateral wall portions 16 and a back wall portion 18. The two lateral wall portions 16 are respectively disposed corresponding to the two opposite lateral sides of the bottom wall 11. The back wall portion 18 is smoothly arched, and disposed corresponding to the rear side of the bottom wall 11.

The bottom wall 11 is adapted for mounting at a circuit board 99 (or electronic device) to hold a transformer 91. When a transformer 91 is positioned on the bottom wall 11, the lead wires 92 of the primary winding of the transformer 91 are supported on the bottom wall 11 at the front side thereof, and the lead wires 94 of the second winding of the transformer 91 that are respectively covered with an electrically insulative material and extended over the top edge of the back wall portion 18 of the upright wall 15 and then turned downwardly and then electrically bonded to the circuit board 99.

According to this first embodiment, the distance L3 between the opposing front and rear edges of the bottom wall 11 is greater than the combined distance of the distance L1 between the starting points of the lead wires 94 of the second winding of the transformer 91 and the back wall portion 18 and the distance L2 of the lead wires 94 of the second winding of the transformer 91 from the top edge of the back wall portion 18 to the circuit board 99, i.e., L3>L1+L2.

The application status of the aforesaid first embodiment will be outlined hereinafter.

Referring to FIG. 3, subject to the design that L3>L1+L2, properly adjusting the combined distance of L1+L2 can comply with the rules for long insulation distance without considering the distance L3. Thus, by means of the integrated one-piece design of the upright wall 15 and electrically insulative bottom wall 11 and the configuration of the upright wall 15, the relationship between the combined distance of L1 and L2 and the distance L3 is established, enabling the lead wires 94 of the second winding of the transformer 91 to be extended over the top edge of the back wall portion 18 and then turned downwardly and bonded to the circuit board 99 to finish the desired insulation distance without maintaining a certain space on the circuit board 99 as adopted in conventional techniques, and therefore the invention avoids wasting circuit board space while meeting safety codes.

It is to be noted that the relation of L3>L1+L2 shown in FIG. 3 can be changed to L3<L1+L2 subject to requirements, for example, if the height of the upright wall is increased to the condition that L1+L2>L3, adjusting the distance L3 can meet the requirement for a relatively longer insulation distance without considering the combined distance of L1+L2.

FIGS. 4-7 illustrate a receptacle 20 for transformer in accordance with a second embodiment of the present invention. This second embodiment is substantially similar to the aforesaid first embodiment with the exception of the conditions stated below.

The back wall portion 28 of the upright wall 25 is shaped like a straight plate; the rear side of the bottom wall 21 of the upright wall 25 is configured to fit the configuration of the back wall portion 28.

The bottom wall 21 comprises a spacer wall portion 211 disposed at the rear side thereof. When the transformer 91 is mounted at the bottom wall 21, the spacer wall portion 211 is stopped against the bobbin 96 of the transformer 19 to keep the transformer 91 apart from the upright wall 25 at a predetermined distance, assuring the desired distance L1.

The back wall portion 28 of the upright wall 25 has a plurality of notches 281 located on the top edge thereof for the passing of the lead wires 94 of the second winding of the transformer 91 therethrough. Thus, the notches 281 keep the lead wires 94 of the second winding of the transformer 91 in place. In this embodiment, there are multiple notches 281 for the passing of the lead wires 94 of the second winding of the transformer 91 to keep the lead wires 94 of the second winding of the transformer 91 in place. However, the number of the notches 281 is not a limitation. Alternatively, the back wall portion 28 of the upright wall 25 can be made having only one single notch 281 for the passing of the lead wires 94 of the second winding of the transformer 91 to keep the lead wires 94 of the second winding of the transformer 91 in place, i.e., the back wall portion 28 of the upright wall 25 can be made having only one single notch 281, or a plurality of notches 281.

The back wall portion 28 of the upright wall 25 further comprises a plurality of secondary-side contacts 282 located on the outer side near the bottom edge thereof. The lead wires 94 of the second winding of the transformer 91 are extended over the top edge of the back wall portion 28 of the upright wall 25 and then turned downwardly and bonded to the secondary-side contacts 282 that are electrically connected to the circuit board 99 (or electrical device). Thus, the secondary-side contacts 282 facilitate electrical connection between the lead wires 94 of the second winding of the transformer 91 and the circuit board 99 (or electrical device).

Each of the two lateral wall portions 26 of the upright wall 25 comprises a retaining portion 261 located on the front edge thereof. Further, the bottom wall 21 comprises two retaining portions 212 located on the front edge thereof. The retaining portions 261 of the two lateral wall portions 26 of the upright wall 25 and the retaining portions 212 of the bottom wall 21 jointly hold the bobbin 96 of the transformer 91, keeping the bobbin 96 in abutment against the spacer wall portion 211. It is to be noted that the number of the retaining portions 212 of the bottom wall 21 is not limited to 2. Alternatively, the bottom wall 21 can be designed to provide one single retaining portion 212*m* achieving the same effects.

The upright wall 25 further comprises two constraint portions 251. When the transformer 91 is mounted at the bottom wall 21, the constraint portions 251 are stopped at the top side of the bobbin 96 of the transformer 91 to hold down the transformer 91 on the bottom wall 21.

According to this second embodiment, when the transformer 91 is mounted at the bottom wall 21, it is secured by the retaining portions 261 of the two lateral wall portions 26 of the upright wall 25 and the retaining portions 212 of the bottom wall 21, held down on the bottom wall 21 by the constraint portions 251, and stopped against the spacer wall portion 211 to assure the desired distance L1.

Other structural details and the achieved effects of this second embodiment are same as the aforesaid first embodiment, and therefore no further description in this regard is necessary.

Figure 8:
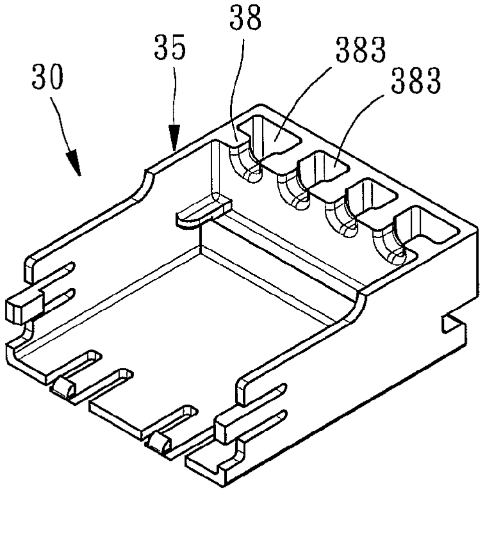
FIG. 8 is an oblique front elevation of a receptacle for transformer in accordance with a third embodiment of the present invention.

FIG. 8 illustrates a receptacle 30 for transformer in accordance with a third embodiment of the present invention. This third embodiment is substantially similar to the aforesaid second embodiment with the exception of the conditions stated below.

The back wall portion 38 of the upright wall 35 further comprises a plurality of wire-guide frame portions 383. The lead wires of the second winding of the transformer (not shown) are respectively inserted through the wire-guide frame portions 383. Thus, the wire-guide frame portions 383 keep the lead wires of the second winding of the transformer in a good order.

Other structural details and the achieved effects of this third embodiment are same as the aforesaid second embodiment, and therefore no further description in this regard is necessary.

Figure 9:
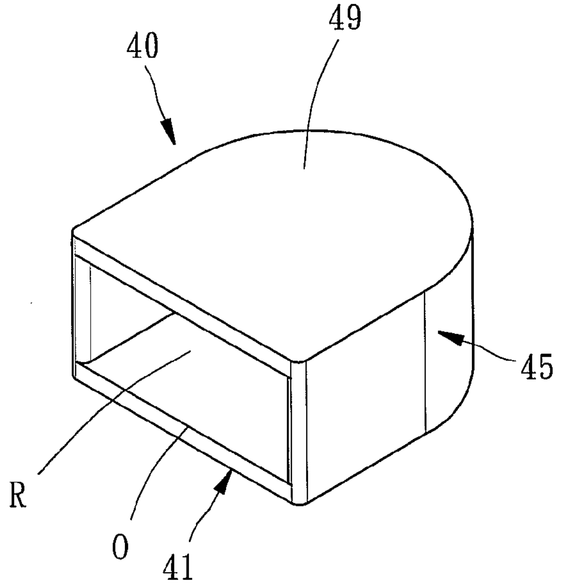
FIG. 9 is an oblique front elevation of a receptacle for transformer in accordance with a fourth embodiment of the present invention.
Figure 10:
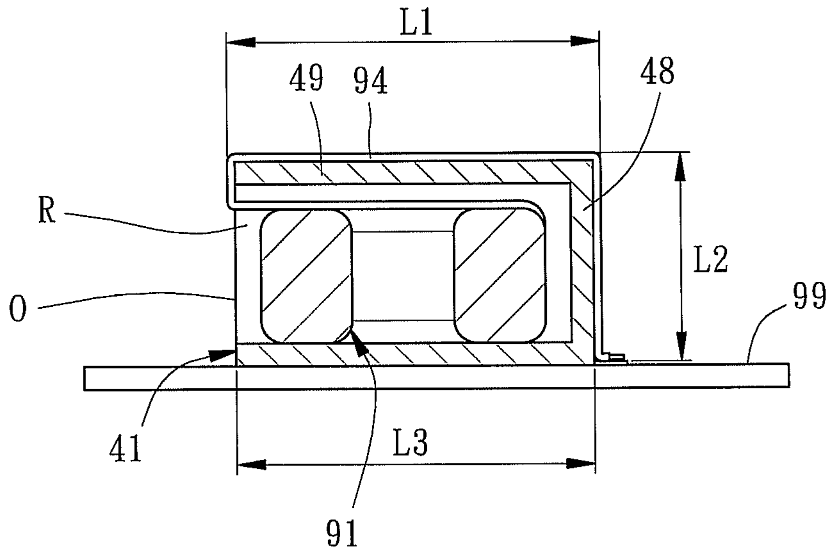
FIG. 10 is a schematic sectional view of the receptacle for transformer in accordance with the fourth embodiment of the present invention.

FIGS. 9 and 10 illustrate a receptacle 40 for transformer in accordance with a fourth embodiment of the present invention. This fourth embodiment is substantially similar to the aforesaid first embodiment with the exception of the conditions stated below.

The receptacle 40 further comprises a cover plate 49. The cover plate 49 is formed integral with the upright wall 45 and covered on the area surrounded by the upright wall 45.

The upright wall 45, the cover plate 49 and the bottom wall 41 define an accommodation chamber R and an opening O at a front side of the accommodation chamber R. The transformer 91 is inserted through the opening O into the inside of the accommodation chamber R.

The lead wires 94 of the second winding of the transformer 91 are extended out of the accommodation chamber R over the front edge of the cover plate 49 toward the rear side of the receptacle 40 along the top surface of the cover plate 49, and then turned downwardly over the top edge of the back wall portion 48 of the upright wall 45, and then bonded to the circuit board 99.

When compared with the aforesaid first embodiment, the cover plate 49 of this fourth embodiment prolongs the insulation distance of the lead wires 94 of the second winding of the transformer 91. Thus, the distance L3 between the opposing front and rear edges of the bottom wall 41 is shorter than the combined distance of the distance L1 between the starting points of the lead wires 94 of the second winding of the transformer 91 and the back wall portion 48 and the distance L2 of the lead wires 94 of the second winding of the transformer 91 from the top edge of the back wall portion 48 to the circuit board 99, i.e., L3<L1+L2.

Thus, the desired insulation distance can be determined directly by the distance L3 without maintaining a certain space on the circuit board 99 as adopted in conventional techniques, and therefore this fourth embodiment avoids wasting circuit board space while meeting safety codes.

Other structural details and the achieved effects of this fourth embodiment are same as the aforesaid first embodiment, and therefore no further description in this regard is necessary.

Figure 11:
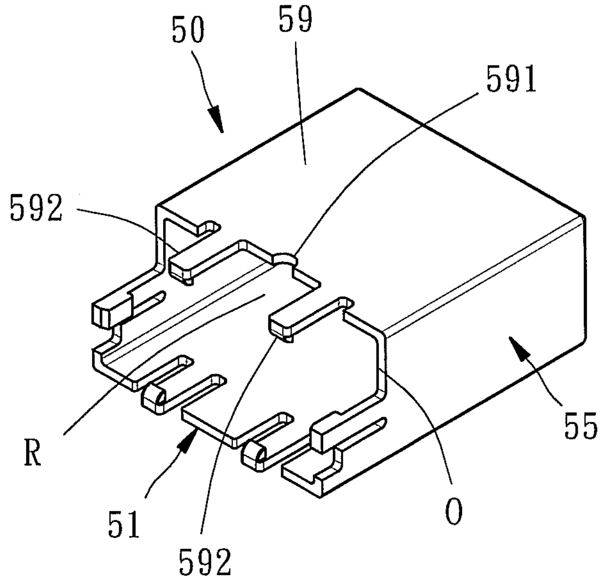
FIG. 11 is an oblique front elevation of a receptacle for transformer in accordance with a fifth embodiment of the present invention.
Figure 12:
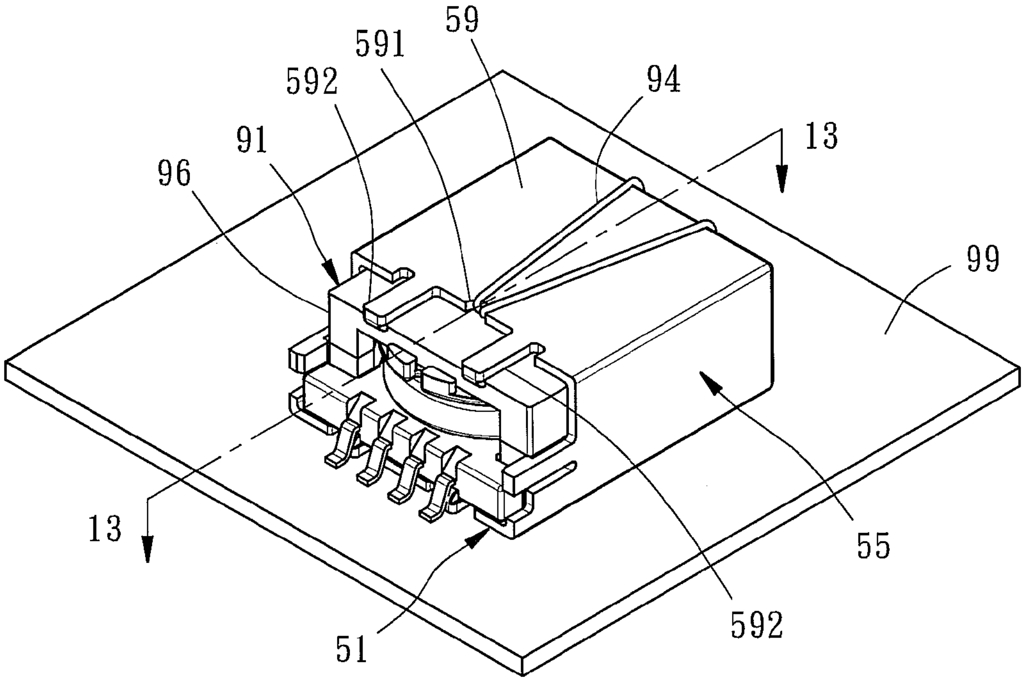
FIG. 12 is a schematic applied view of the fifth embodiment of the present invention, illustrating the receptacle installed in a circuit board and a transformer mounted inside the receptacle.
Figure 13:
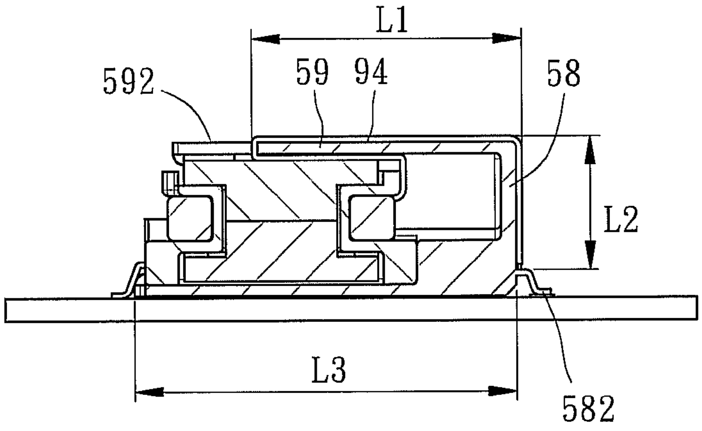
FIG. 13 is a sectional view taken along line 13-13 of FIG. 12.

FIGS. 11-13 illustrate a receptacle 50 for transformer in accordance with a fifth embodiment of the present invention. This fifth embodiment is substantially similar to the aforesaid second embodiment with the exception of the conditions stated below.

The receptacle 50 further comprises a cover plate 59. The cover plate 59 is formed integral with the upright wall 55 and covered on the area surrounded by the upright wall 55. Further, the cover plate 59 has a notch 591 located on the front edge thereof for the passing of the lead wires 94 of the second winding of the transformer 91 to keep the lead wires 94 in place, and two retaining portions 592 for engagement with the bobbin 96 of the transformer 91.

The upright wall 55, the cover 59 and the bottom wall 51 define an accommodation chamber R and an opening O at a front side of the accommodation chamber R. The transformer 91 is inserted through the opening O into the inside of the accommodation chamber R.

When compared with the aforesaid second embodiment, the cover plate 59 of this fifth embodiment prolongs the insulation distance of the lead wires 94 of the second winding of the transformer 91. Thus, the distance L3 between the opposing front and rear edges of the bottom wall 51 can be greater (or shorter) than the combined distance of the distance L1 between the starting points of the lead wires 94 of the second winding of the transformer 91 and the back wall portion 58 and the distance L2 of the lead wires 94 of the second winding of the transformer 91 from the top edge of the back wall portion 58 to the circuit board 99, i.e., L3>L1+L2 or L3<L1+L2.

Under the condition that L3>L1+L2, adjusting the combined length of L1+L2 can meet long insulation distance codes without considering the length of L3. Under the condition that L3<L1+L2, the insulation distance is determined by L3 directly, and L3 assures enough insulation distance.

The aforesaid two conditions can make enough insulation distance without maintaining a certain space on the circuit board 99 as adopted in conventional techniques, and therefore this fifth embodiment avoids wasting circuit board space while meeting safety codes.

Other structural details and the achieved effects of this fifth embodiment are same as the aforesaid first embodiment, and therefore no further description in this regard is necessary.

Figure 14:
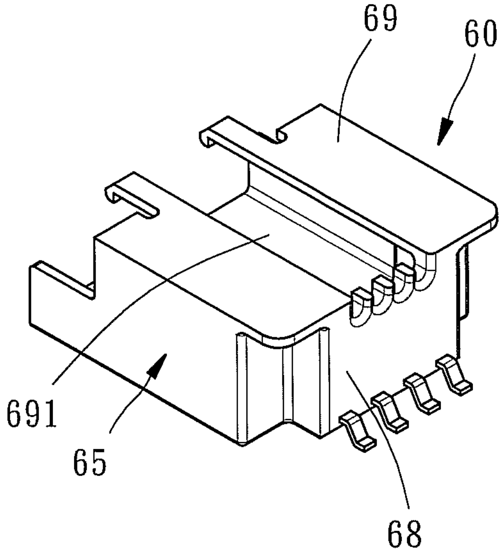
FIG. 14 is an oblique rear elevation of a receptacle for transformer in accordance with a sixth embodiment of the present invention.
Figure 15:
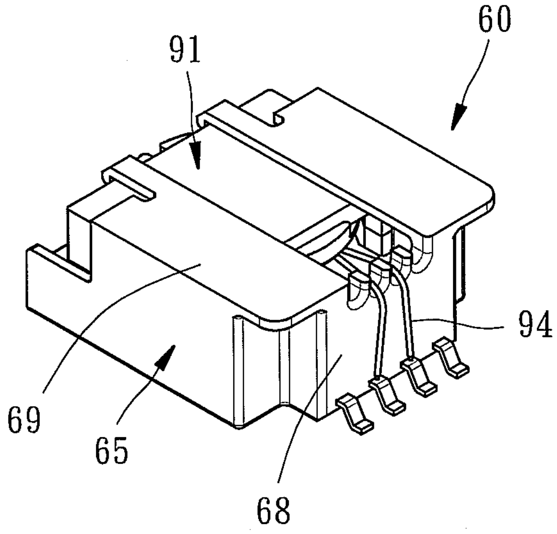
FIG. 15 is an applied view of the sixth embodiment of the present invention, illustrating a transformer mounted in the receptacle at a circuit board.

FIGS. 14 and 15 illustrate a receptacle 60 for transformer in accordance with a sixth embodiment of the present invention. This sixth embodiment is substantially similar to the aforesaid second embodiment with the exception of the conditions stated below.

The receptacle 60 further comprises a cover plate 69. The cover plate 69 is formed integral with the upright wall 65 and covered on two lateral sides of the area surrounded by the upright wall 65, defining an opening 691 on the middle. The lead wires 94 of the second winding of the transformer 91 are extended over the top edge of the back wall portion 68 of the upright wall 65 and turned downwardly along the outer surface of the back wall portion 68, and then bonded to the circuit board 99.

When compared with the aforesaid second embodiment, the cover plate 69 of this sixth embodiment is covered on two lateral sides of the area surrounded by the upright wall 65 so that the insulation distance between the two lateral sides is prolonged. Thus, the devices disposed at two opposite lateral sides outside the upright wall 65 can be kept relatively closer to the upright wall 65, saving circuit board space.

Other structural details and the achieved effects of this sixth embodiment are same as the aforesaid second embodiment, and therefore no further description in this regard is necessary.

Figure 16:
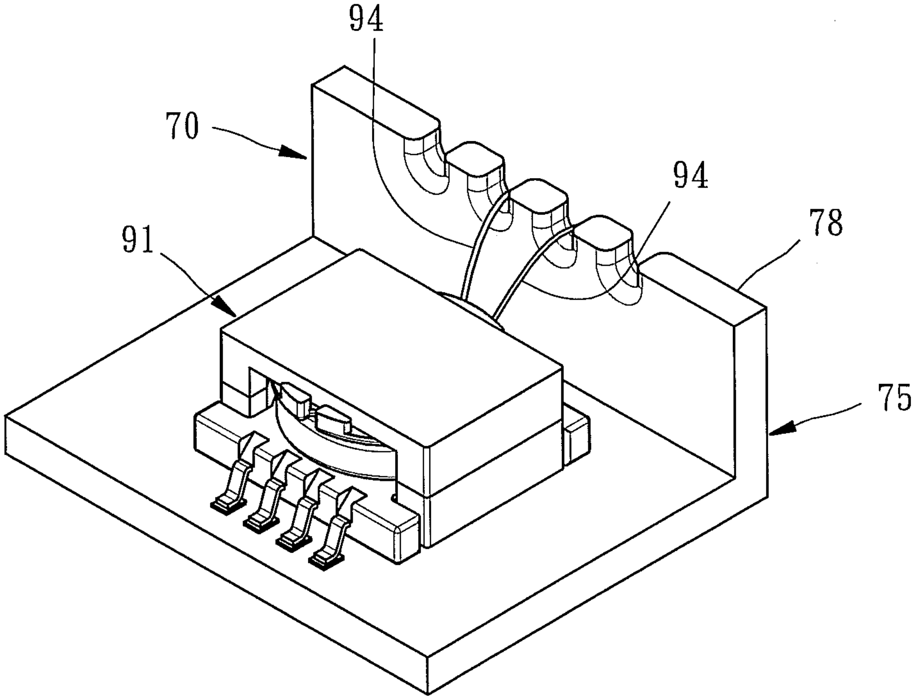
FIG. 16 illustrates a transformer mounted in a receptacle in accordance with a seventh embodiment of the present invention.
Figure 17:
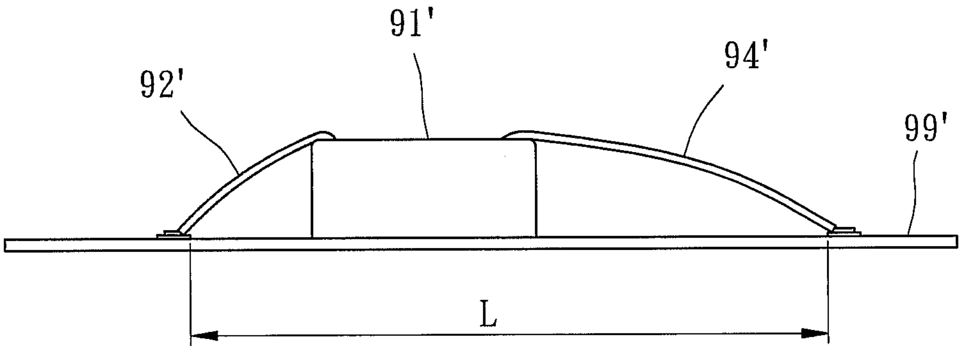
FIG. 17 is a schematic drawing illustrating the installation of a transformer in a circuit board according to the prior art.
Figure 18:
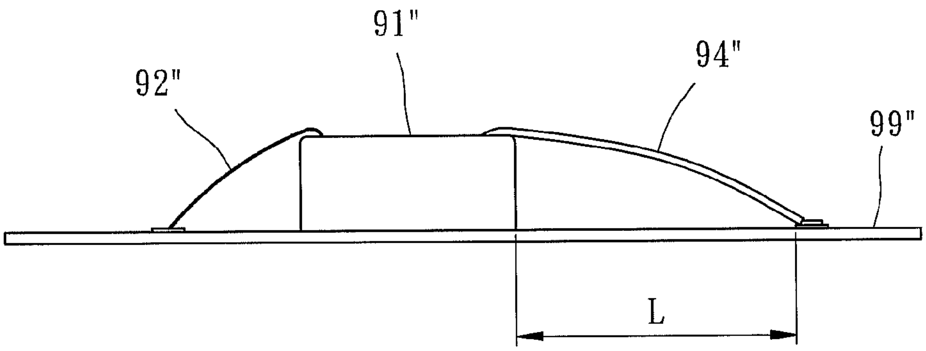
FIG. 18 is a schematic drawing illustrating another installation method of a transformer in a circuit board according to the prior art.

FIG. 16 illustrates a receptacle 70 for transformer in accordance with a seventh embodiment of the present invention. This seventh embodiment is substantially similar to the aforesaid second embodiment with the exception of the conditions stated below.

The upright wall 75 of this seventh embodiment eliminates the aforesaid lateral wall portions and simply has a back wall portion 78.

Thus, the lead wires 94 of the second winding of the transformer 91 are extended over the top edge of the back wall portion 78 of the upright wall 75 and turned downwardly along the outer surface of the back wall portion 78, and then bonded to the circuit board (not shown).

When compared with the aforesaid second embodiment, this seventh embodiment eliminates the lateral wall portions, simply using the back wall portion 78 of the upright wall 75 to achieve the effect of prolonging the insulation distance.

Other structural details and the achieved effects of this seventh embodiment are same as the aforesaid second embodiment, and therefore no further description in this regard is necessary.

In conclusion, by means of the structural arrangement of the bottom wall and the upright wall, the receptacle effectively prolongs the insulation distance without maintaining a certain space on the circuit board as adopted in conventional techniques, and therefore the invention avoids wasting circuit board space while meeting safety codes.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A receptacle, comprising:

a bottom wall made of an electrically insulative material; and an upright wall made of an electrically insulative material, said upright wall extending upwardly from the border of said bottom wall, said upright wall comprising a back wall portion corresponding to a rear side of said bottom wall;

wherein said bottom wall is adapted for mounting at a circuit board or electronic device to hold a transformer in such a manner that lead wires of a primary winding of said transformer are disposed at a front side relative to said bottom wall; insulated lead wires of a secondary winding of said transformer are extended over a top edge of said back wall portion of said upright wall and turned downwardly toward said circuit board or electronic device and then electrically bonded to said circuit board or electronic device, wherein said back wall portion of said upright wall comprises a plurality of secondary-side contacts located on an outer bottom side thereof for bonding to said circuit board or electronic device; the lead wires of the second winding of said transformer are extended over the top edge of said back wall portion and then turned downwardly and bonded to said secondary-side contacts.

2. The receptacle as claimed in claim 1, wherein said upright wall and said bottom wall are integrally formed in one piece.

3. The receptacle as claimed in claim 1, wherein said back wall portion of said upright wall comprises at least one notch located on the top edge thereof for the passing of the lead wires of the secondary winding of said transformer.

4. The receptacle as claimed in claim 1, wherein said upright wall comprises at least one constraint portion stopped at a top side of said transformer to hold down said transformer on said bottom wall.

5. The receptacle as claimed in claim 1, further comprises a spacer wall portion disposed at a rear side of said bottom wall and stopped against said transformer to keep said transformer apart from said upright wall at a predetermined distance.

6. The receptacle as claimed in claim 1, wherein said upright wall further comprises two lateral wall portions disposed at two opposite lateral sides relative to said bottom wall.

7. The receptacle as claimed in claim 6, wherein said lateral wall portions of said upright wall each comprise at least one retaining portion located on a front edge thereof for retaining said transformer.

8. The receptacle as claimed in claim 6, further comprising a cover plate formed integral with said upright wall, said cover plate covering two opposite lateral sides of the area surrounded by said upright wall and defining an opening on a middle part thereof; the insulated lead wires of the second winding of said transformer are extended over the top edge of said upright wall and then turned downwardly along an outer surface of said upright wall and then bonded to said circuit board or electronic device.

9. The receptacle as claimed in claim 1, further comprising a cover plate formed integral with said upright wall, said cover plate covering at least one part of the area surrounded by said upright wall; the insulated lead wires of the secondary winding of said transformer are extended over a front edge of said cover plate along a top surface of said cover plate toward a rear side of said cover plate and then turned downwardly over the top edge of said back wall portion of said upright wall, and then bonded to said circuit board or electronic device.

10. The receptacle as claimed in claim 9, wherein said cover plate comprises at least one notch located on a front edge thereof for the passing of the insulated lead wires of the secondary winding of said transformer.

11. The receptacle as claimed in claim 9, wherein said cover plate comprises at least one retaining portion located on the front edge thereof for retaining a bobbin of said transformer.

12. The receptacle as claimed in claim 1, wherein said back wall portion of said upright wall comprises at least one wire-guide frame portion for the passing of the insulated lead wires of the second winding of said transformer.

13. The receptacle as claimed in claim 1, wherein said back wall portion of said upright wall is shaped like a straight plate; said bottom wall has a rear side configured subject to the configuration of said back wall portion of said upright wall.

14. The receptacle as claimed in claim 1, wherein said back wall portion of said upright wall is smoothly arched; said bottom wall has a rear side configured subject to the smoothly arched configuration of said back wall portion of said upright wall.

* * * * *